United States Patent [19]

Kobayashi

[11] Patent Number: 5,651,014
[45] Date of Patent: Jul. 22, 1997

[54] RATE GENERATOR CIRCUIT FOR SEMICONDUCTOR TEST SYSTEM

[75] Inventor: Minoru Kobayashi, Sama Gyoda, Japan

[73] Assignee: Advantest Corporation, Tokyo, Japan

[21] Appl. No.: 650,914

[22] Filed: May 17, 1996

[30] Foreign Application Priority Data

May 17, 1995 [JP] Japan .................................. 7-142514

[51] Int. Cl.[6] .................................................. G06F 11/00
[52] U.S. Cl. ............................................................ 371/27
[58] Field of Search ........................... 371/27, 22.5, 22.6, 371/24, 28

[56] References Cited

U.S. PATENT DOCUMENTS

5,406,132 4/1995 Housako ............................. 371/27

*Primary Examiner*—Vincent P. Canney
*Attorney, Agent, or Firm*—Knobbe, Martens, Olson & Bear, LLP

[57] ABSTRACT

A rate generator circuit for generating test signals whose timings vary in a pulse by pulse basis for testing semiconductor devices includes: a reference clock to determine a basic operational timing of the semiconductor test system; a pattern generator which stores rate data indicating timings of each pulse for the test signals for reading out a plurality of the rate data in parallel in synchronism with a system clock; a temporary storage for temporary storing and transferring the plurality of rate data; a timing generator for generating a plurality of sets of a timing pulse and timing data, each of the rate data being a combination of a coarse timing and a fine timing, at least one set of the timing pulse and the timing data is produced based on a sum of all of the plurality of the rate data and a fine timing of a previous cycle of the system clock, and each of the other sets of the timing pulse and the timing data is produced based on corresponding one of the plurality of the rate data and the fine timing of the previous cycle; and a waveform generator for adding a delay time indicated by the timing data to corresponding one of the timing pulse and converting the plurality of the timing pulses provided with the delay times into a series signal.

8 Claims, 7 Drawing Sheets

RATE GENERATOR CIRCUIT FOR SEMICONDUCTOR TEST SYSTEM

FIELD OF THE INVENTION

This invention relates to a rate generator circuit of a semiconductor test system, and more particularly, to a rate generator circuit for an IC tester which is capable of generating test pattern signals with a high repetition rate without using high speed circuit components.

BACKGROUND OF THE INVENTION

In testing a semiconductor device by a semiconductor test system, the semiconductor device under test is provided with test signals and the resulting output signals of the semiconductor device are compared with expected data to determine whether the semiconductor device functions correctly or not. The repetition rate of the test pattern signals is called a tester rate and is determined by a rate generator circuit. In a modern semiconductor test system, the tester rate dynamically varies in a cycle by cycle basis by a rate generator circuit to properly test a complicated semiconductor device.

Figure 4:
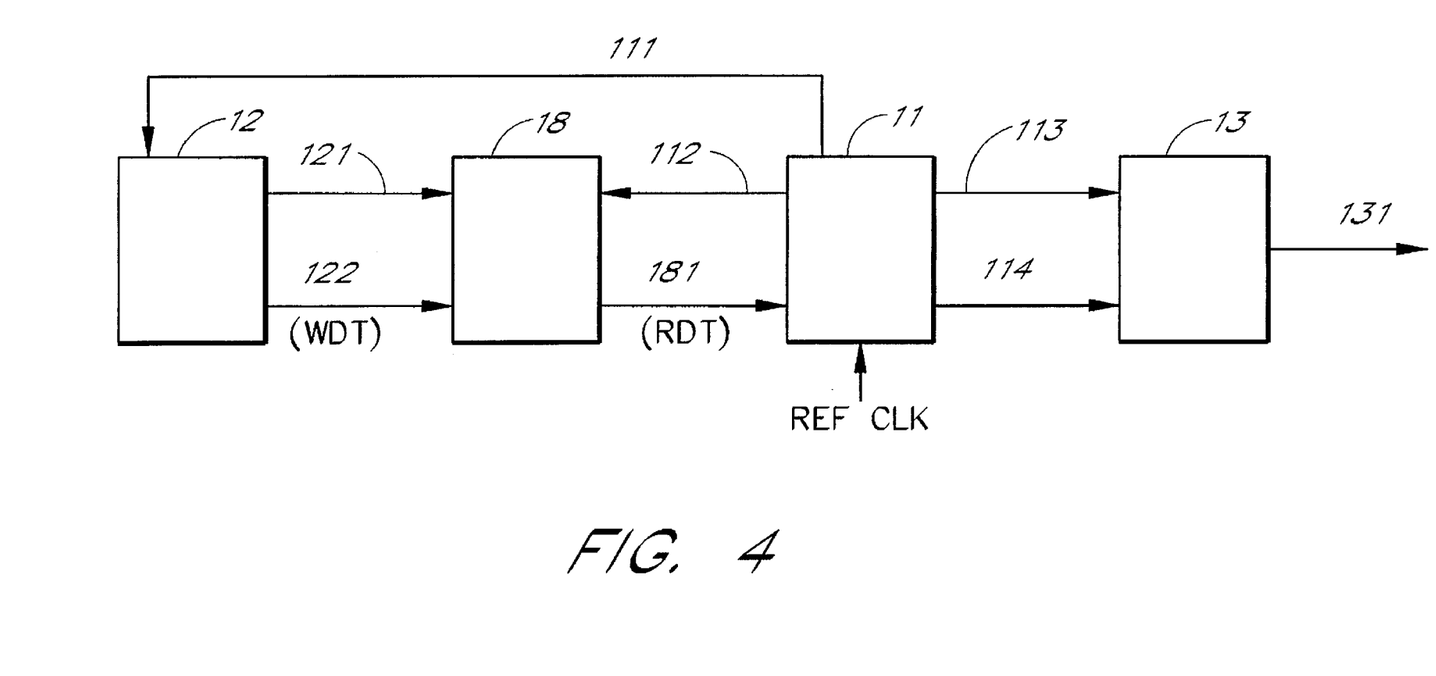
FIG. 4 is a block diagram showing a configuration of the conventional rate generator circuit.

FIG. 4 shows a block diagram of a conventional rate generator circuit. The rate generator circuit is formed of a pattern generator 12, a temporary storage 18, a timing generator 11 and a waveform generator 13.

The pattern generator 12 stores rate data for generating a test pattern. The rate data is read out in each clock cycle of a system clock 111 and is sent to the temporary storage 18. The rate data (WDT) is temporarily stored in the temporary storage 18 by a write clock which is synchronized with the system clock 111.

The timing generator 11 reads the rate data (RDT) from the temporary storage 18 with a read clock which is synchronized with the system clock. For each cycle, the timing generator 11 produces a timing pulse and a timing data based on the rate data received from the storage 18. The timing pulse represents a coarse timing indicated by the rate data while the timing data represents a fine timing indicated by the rate data. The coarse timing is a time length which is integer multiple of one cycle of a reference clock in the semiconductor test system and the fine timing is a time length which is shorter than the one cycle of the reference clock.

The waveform generator 13 converts the timing data into a delay time to be added to the timing pulse from the timing generator 11. Thus, the waveform generator 13 generates a test pattern signal by adding the delay time to the timing pulse and by waveforming the timing pulse.

In this rate generator circuit, modernly, the temporary storage 18 has a pipeline structure in which a plural stages of storage such as shift registers (not shown) are series connected to improve a data transfer speed. The rate data (WDT) from the pattern generator 12 is written in the first stage of the registers by the write clock synchronized with the system clock while the rate data (RDT) in the last stage of the registers is read out and transferred to the timing generator 11 by the read clock synchronized with the system clock.

FIG. 5 is a timing chart showing an operation of the rate generator circuit of FIG. 4. In this example, the system clock 111 of FIG. 5A is the same as the timing pulse 113 of FIG. 5C. As noted above, the timing pulse 113 is formed by the coarse timing data designated in the rate data. Although not shown, a reference clock is given to the timing generator whereby the system clock 111 and the timing pulse 113 are generated. For example, the coarse timing in the rate data is an integer multiple of the reference clock. Thus, in each cycle, the time period of the system clock 111, i.e., the timing pulse 113, is determined as an integer multiple of the reference clock based on the rate data given to the timing generator 11.

Figure 5A:
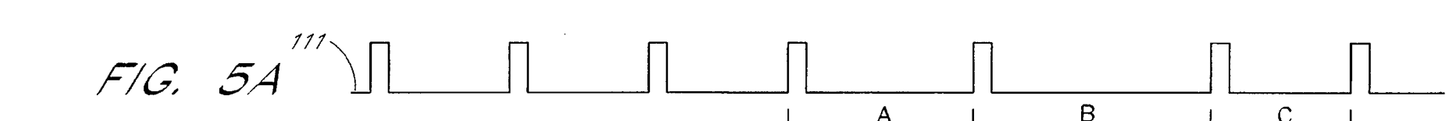
FIG. 5 is a timing chart showing an operation of the conventional rate generator circuit of FIG. 4.
Figure 5B:
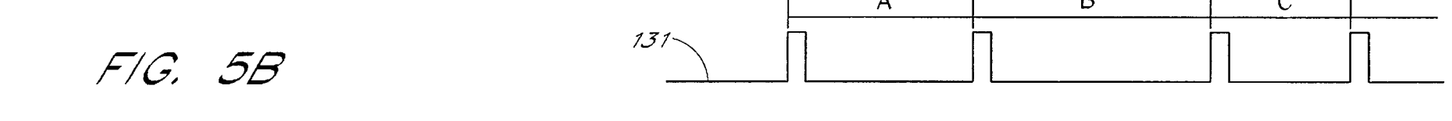
Figures 5C, 5D, 5E:
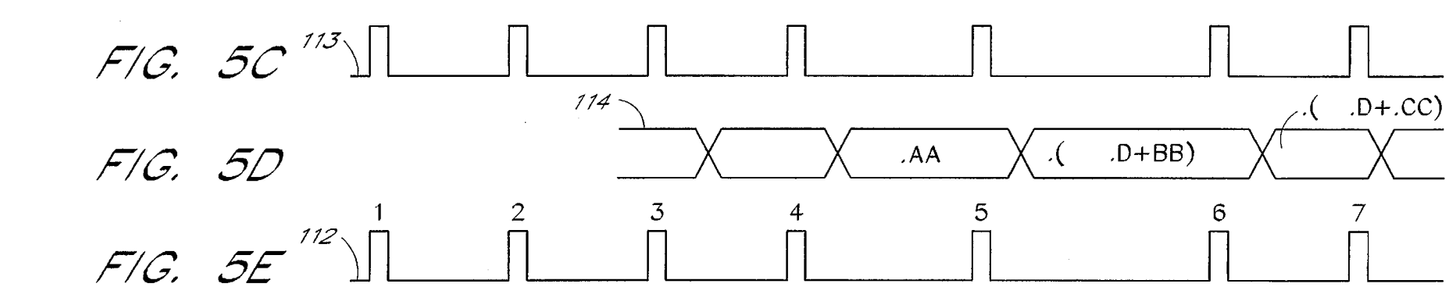
Figure 5F:
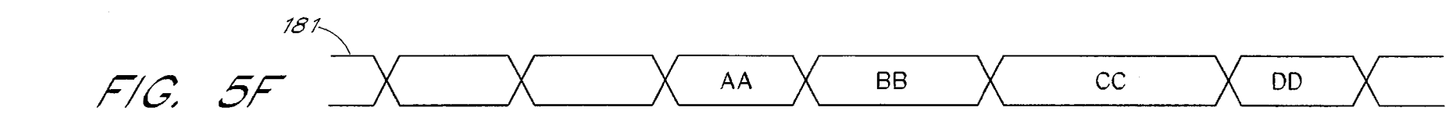
Figure 5G:
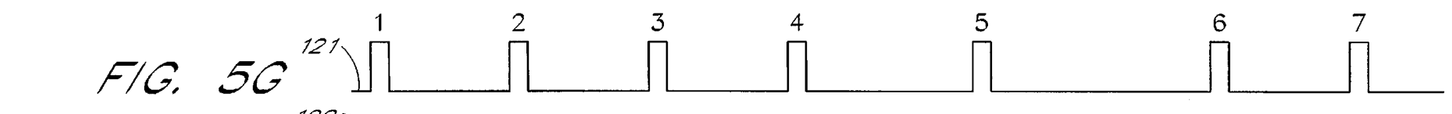
Figure 5H:
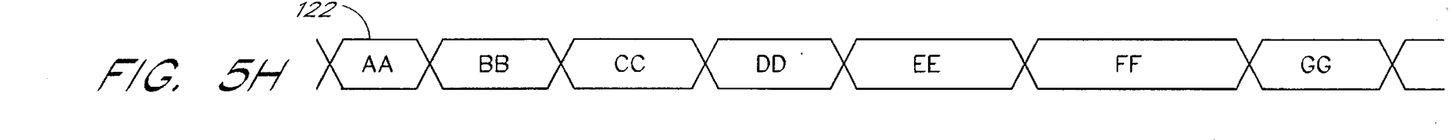

The write clock 121 of FIG. 5G is generated by the pattern generator in synchronism with the system clock 111 to write the rate data 122 of FIG. 5H in the temporary storage 18. Thus, by the first write clock (1) of FIG. 5G, the rate data AA is stored in the first stage register of the temporary storage 18. The rate data BB, CC, DD . . . are consecutively stored in the temporary storage 18 by the write clock (2), (3), (4) . . . as shown in Figures G and H.

The read clock 112 of FIG. 5E is also synchronized with the system clock 111. The read clock 112 is provided to all the stages of the registers in the temporary storage 18 to shift the rate data to the next stage of register by each read clock 112. Thus, the first data AA is shifted toward the last stage register in the temporary storage 18 every time the read clock 112 is provided. The other rate data BB, CC, DD . . . are also consecutively shifted toward the last stage register.

For example, if the pipeline in the temporary storage 18 has two stages of shift registers as in the case of FIG. 5, by the read clock (3) of FIG. 5E, which is the second clock after the first write clock (1), the rate data 181 of FIG. 5F indicating the data AA is output from the temporary storage 18. The rate data AA is received by the timing generator 11 to form a timing pulse 113 and timing data 114 for the waveform generator 13.

By the read clock (4), the rate data BB is output from the temporary storage 18 and is received by the timing generator 11. In this manner, the rate data stored in the pattern generator 12 is transferred to the timing generator 11 through the temporary storage 18 every time the write clock 121 and the read clock 112 are supplied.

When receiving the rate data, the timing generator 11 distinguishes a coarse timing and a fine timing in the rate data. As noted above, the coarse timing is an integer of the reference clock period while the fine timing is a delay time smaller than one period of the reference clock. Based on the coarse timing, the timing generator 11 generates the timing pulse 113 having time intervals which are integer multiple of the reference clock.

The fine timing is added to the next rate data. In case where the added data carries over the integer of the reference clock, the timing pulse 113 is produced based on the coarse timing, i.e., the integer of the reference clock formed by the addition. The timing pulse 113 is provided to the waveform generator 13. The remainder of the addition, which is smaller than the reference clock period, is transferred to the waveform generator 13 as the timing data 114.

When receiving the timing pulse 113 and the timing data 114, the waveform generator 13 converts the timing data into a delay time and adds the delay time to the timing pulse 113 to generate a test pattern signal of FIG. 5B. In this manner, the test pattern signal having the timing intervals of A, B, C is generated based on the rate data stored in the pattern generator 12.

In the conventional rate generator circuit of FIGS. 4 and 5, the repetition rate of the test pattern signal is limited by the operational speed of the circuit components used in the circuit. For example, a time required for the write cycle to write the rate data from the pattern generator 12 to the temporary storage 18, and a time required for the read cycle to read the rate data from the temporary storage 18 for the timing generator 11 are determined by the operational speed of the circuit components used in the pattern generator, the temporary storage and the timing generator. Therefore, at present, it is considered that the test pattern signal, or a tester rate, of 128 MHz (8 ns period) or higher is difficult to generate in the conventional technology.

SUMMARY OF THE INVENTION

It is, therefore, an object of the present invention to provide a rate generator circuit for a semiconductor test system which is capable of generating a significantly higher rate of test pattern signals without using a high speed circuit components.

It is another object of the preset invention to provide a rate generator circuit for a semiconductor test system which is capable of generating a high frequency test pattern signal by a low cost circuit arrangement.

In order to achieve the above objectives, the present invention incorporates a specific type of space division technology in the transfer of rate data and data accumulation procedures in the process of generating timing pulses. The rate generator circuit of the present invention is to be used in a semiconductor test system for generating test signals whose timings vary dynamically in a cycle by cycle basis for testing semiconductor devices. The rate generator circuit of the present invention includes:

a reference clock to determine a basic operational timing of the semiconductor test system;

a pattern generator which stores rate data indicating timings of each pulse for the test signals for reading out a plurality of the rate data in parallel at the same time in synchronism with a system clock;

a temporary storage which receives the plurality of the rate data in parallel from the pattern generator and transferring the plurality of rate data in synchronism with the system clock;

a timing generator which receives the plurality of the rate data in parallel from the temporary storage and generating a plurality of sets of a timing pulse and timing data, each of the rate data from the temporary storage being a combination of a coarse timing of the pulse which is an integer multiple of a period of the reference clock and a fine timing of the pulse which is a time length shorter than the period of the reference clock, at least one set of the timing pulse and the timing data is produced based on a sum of all of the plurality of the rate data and a fine timing of a previous cycle of the system clock, and each of the other sets of the timing pulse and the timing data is produced based on corresponding one of the plurality of the rate data and the fine timing of the previous cycle; and a waveform generator which receives the plurality of sets of the timing pulse and the timing data in parallel for adding a delay time indicated by the timing data which is smaller than the period of the reference clock to corresponding one of the timing pulse, the waveform generator converting the plurality of the timing pulses provided with the delay times into a series signal.

According to the present invention, the rate generator circuit for a semiconductor test system can generate a high repetition rate of test pattern signals without using a high speed circuit components. Thus, it is possible to generate high frequency test pattern signals by a low cost circuit arrangement.

As a result, in an example of processing four rate data in parallel in the rate generator circuit in which a frequency of the each rate data is 125 MHz (8 ns per cycle) as in the conventional technology, the rate generator circuit of the present invention can generate four times higher frequency timing pulses, i.e., 500 MHz (2 ns per cycle) without using any higher speed circuit components.

DETAILED DESCRIPTION OF THE PREFERRED EMBODIMENTS

Figure 1:
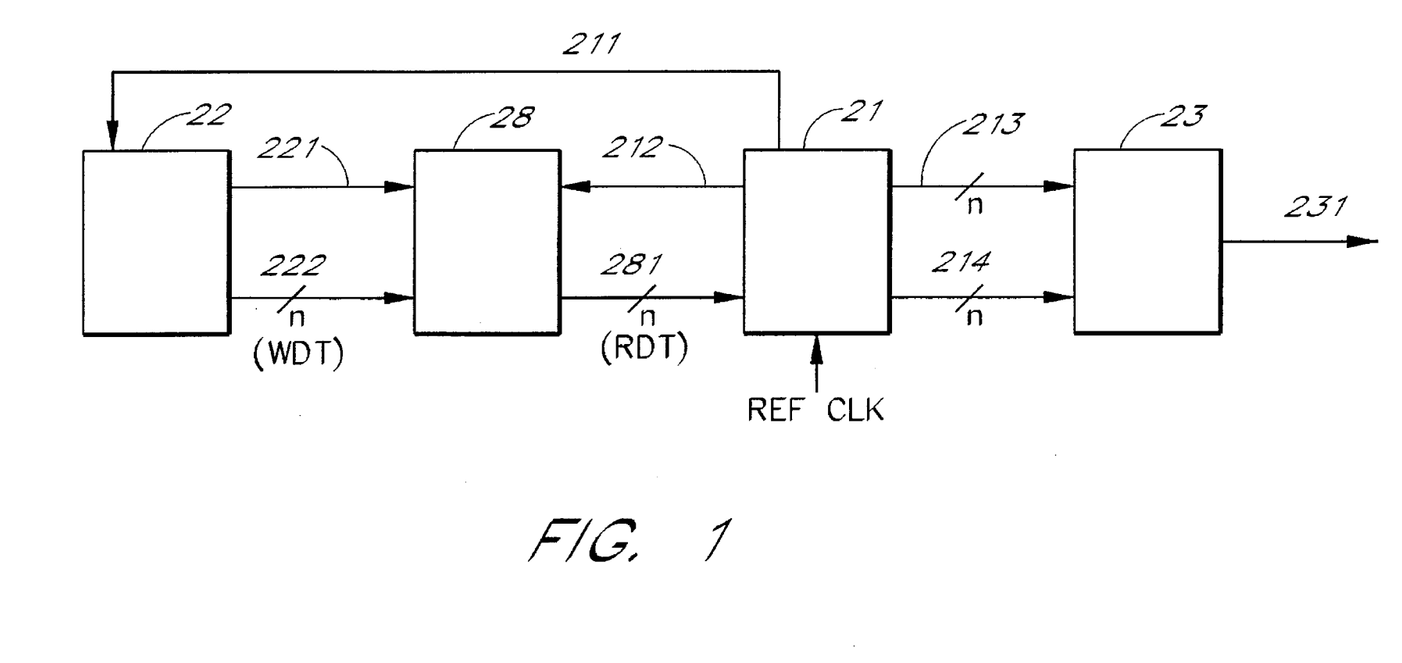
FIG. 1 is a block diagram showing a basic configuration of the rate generator circuit of the present invention.

The preferred embodiment of the present invention will be explained with reference to the drawings. The first embodiment of the present invention is shown in the block diagram of FIG. 1. In this example, the rate generator circuit is formed of a pattern generator 22, a temporary storage 28, a timing generator 21 and a waveform generator 23. In the example of FIG. 1, a plurality of data and pulses are transferred in parallel. A reference clock which determines a basic operational timing of the semiconductor test system is also provided to the timing generator 21.

By the timing of a system clock 211, the pattern generator 22 is accessed to read out n rate data 222 which are parallel one another. The temporary storage 28 has a plurality of storage elements, such as shift registers, in parallel to temporary store the n rate data 222 by the timing of a write clock 221. The temporary storage 28 is provided with a read clock 212 which is synchronized with the system clock 211 to transfer the n rate data in parallel toward the next stage of registers.

After the predetermined number of read clock, the rate data which are n data in parallel are received by the timing generator 21. In the timing generator 21, all the rate data received in parallel from the temporary storage 28 are accumulated in addition to the remainder of a previous cycle showing a fine timing to form an overall accumulated data. As noted above with respect to the conventional example, the rate data is separated into a coarse timing which is an integer multiple of the reference clock and a fine timing which is a delay time smaller than one period of the reference clock.

A first timing pulse is produced based on the coarse timing of the overall accumulated data. The next timing pulse will be produced based on the timing difference from the first timing pulse. Also, first timing data showing the fine timing is produced. The fine timing in this case is a delay time obtained by eliminating the coarse timing from the overall accumulated data.

A second timing pulse is produced with reference to the first timing pulse based on first rate data among the n rate data received in parallel. The first rate data is separated into the coarse timing and the fine timing. Thus, the second timing pulse is generated based on the coarse timing which is a time after a certain integer multiple of the reference clock designated in the coarse timing from the first timing pulse. The second timing data is also produced by accumulating the fine timing in the first rate data with the fine timing of the previous cycle.

A third timing pulse is produced with reference to the second timing pulse based on second rate data among the n rate data received in parallel. The second rate data is separated into a corresponding coarse timing and a fine timing. Thus, the third timing pulse is generated based on the coarse timing which is a time after a certain integer multiple of the reference clock designated in the coarse timing from the second timing pulse. The third timing data is also produced by accumulating the fine timing of the second rate data with the second timing data.

In a similar manner, a n-th timing pulse is produced with reference to the (n-1)-th timing pulse based on the (n-1)-th rate data in the n rate data received in parallel. The (n-1)-th rate data is separated into a coarse timing and a fine timing. Thus, the n-th timing pulse is generated based on the coarse timing which is a time after a certain integer multiple of the reference clock designated in the coarse timing from the (n-1)-th timing pulse. The n-th timing data is also produced by accumulating the fine timing of the (n-1)-th rate data with the (n-1)-th timing data.

The waveform generator 23 receives n sets of the timing pulse and the timing data in parallel from the timing generator 21. The waveform generator has n delay circuits in parallel each of which receives a corresponding set of the timing pulse and the timing data. In the delay circuit, delay elements are provided whereby the delay data is interpreted to a corresponding delay time. The delay time has a higher resolution than the reference clock period. Each of the timing pulses passes through the corresponding delay element while receiving the delay time produced based on the delay data expressed in the timing data.

The waveform generator 23 includes an OR circuit to combine all the timing pulses which have been provided with delay times in the delay elements. At the output of the OR circuit, the parallel timing pulses are combined into a series signal. Therefore, timing signal (test signals) having n times higher repetition rate will be generated by the rate generator circuit of the present invention.

Figure 2:
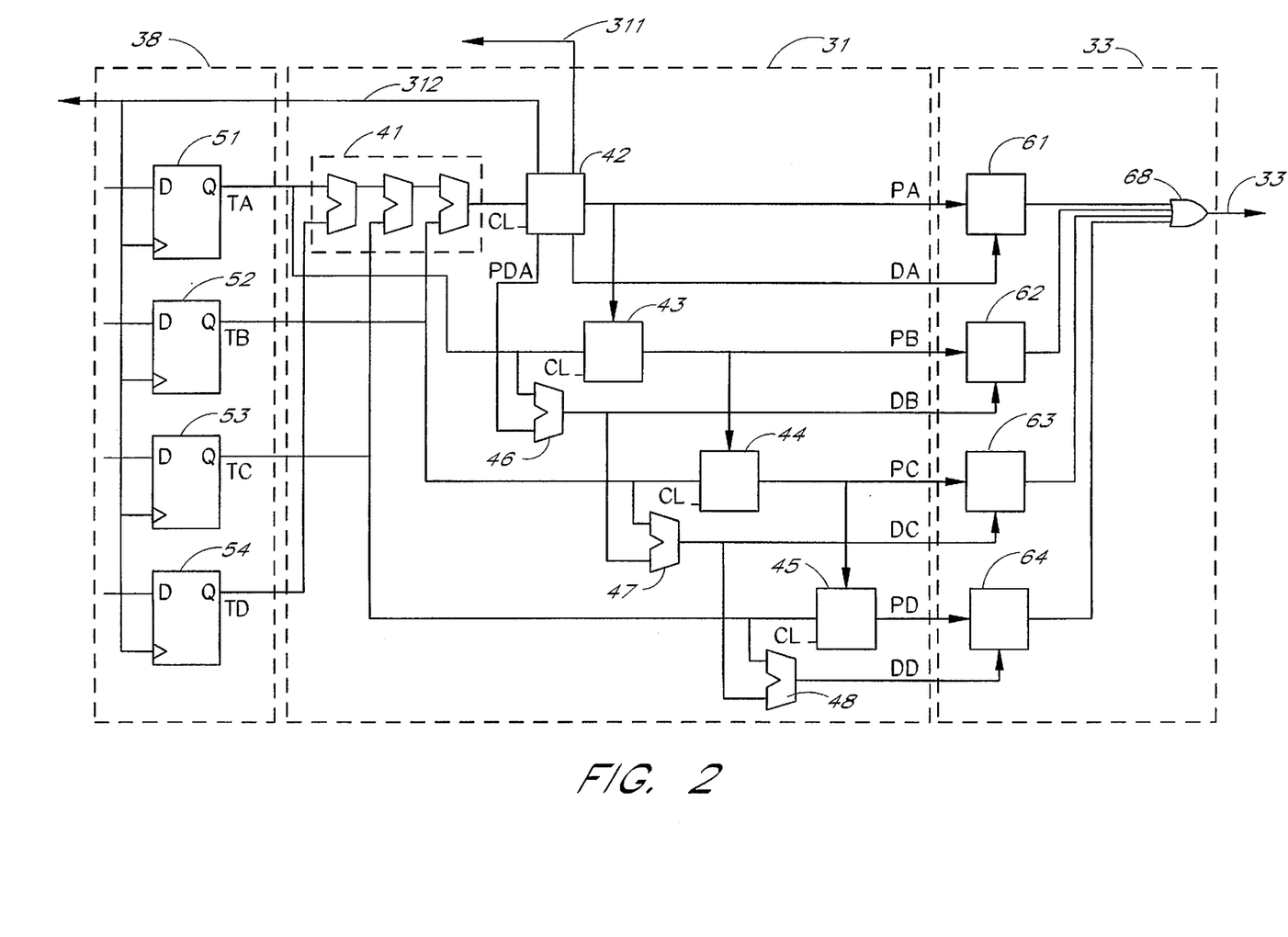
FIG. 2 is a block diagram showing an example of circuit structure of the present invention in which four rate data are processed in parallel.

A more specific example of the present invention is shown in FIG. 2. FIG. 2 is a block diagram showing an example of circuit structure of the present invention in which four rate data are processed in parallel. Therefore, the test signals having four times higher repetition rate can be generated by this rate generator circuit.

The circuit diagram of FIG. 2 mainly shows a structure of a timing generator 31. A reference clock which is a basic clock for the overall operation of the semiconductor test system is supplied to the timing generator 31 for appropriate circuit components in the block diagram. The four rate data are generated in parallel by a pattern generator by the timing of a system clock 311. By a read clock 312, the rate data are transferred in a plural stages of shift registers in a temporary storage 38 stage by stage.

The last stage of four shift registers 51–54 are shown in the temporary storage 38 of FIG. 2. Although not shown specifically, since each of the rate data TA-TD is formed of a plurality of bits, each of the registers 51–54 is also formed of a plurality of flip-flops to accommodate the plurality of bits of the rate data. The four rate data are transferred to the timing generator 31 in parallel at the same time by the read clock 312.

Figure 6:
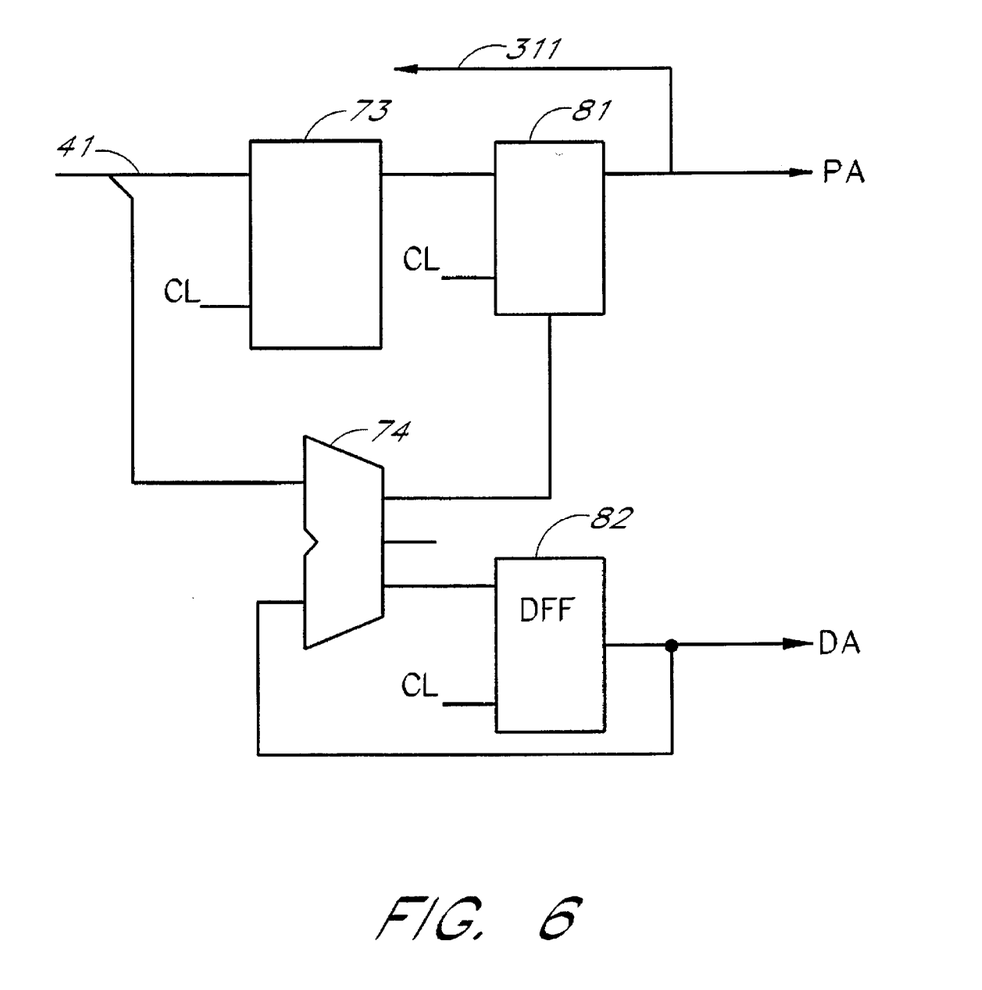
FIG. 6 shows a phase accumulator which can be utilized in the circuits of FIGS. 1 and 2.

The timing generator 31 includes a data accumulator 41 which is formed of three accumulators, a phase accumulator 42 which is shown in FIG. 6 in more detail, accumulators 46, 47 and 48 and counters 43, 44 and 45. A waveform generator 33 is formed of delay circuits 61–64 and an OR circuit 68. An output of the OR circuit is used as a test signal for semiconductor devices.

As will be described, the data accumulator 41 and the phase accumulator are used for obtaining an overall accumulated data as noted above with reference to FIG. 1. Each of the counters 43–45 is used for generating a timing pulse by counting the number of the reference clock based on a coarse timing. Each of the accumulators 46–48 is used for generating timing data corresponding to the timing pulse indicating a delay time having a smaller time resolution than the reference clock period.

As noted above, the four rate data TA, TB, TC and TD from the four parallel registers 51, 52, 53 and 54 in the temporary storage 38 are received by the timing generator 31. All of the rate data TA-TD are provided to the data accumulator 41 whereby accumulated one another. The accumulated result is provided to the phase accumulator 42. As will be described in more detail later with reference to FIG. 6, the phase accumulator 42 includes an adder, a counter and a delay circuit and a delay flip-flop. The delay flip-flop stores timing data PDA showing a fine timing of a previous cycle of a system clock.

The phase accumulator 42 outputs the timing data PDA showing the fine timing of the previous test cycle to the accumulator 46 where it is accumulated with the output data of the data accumulator 41 to obtain an overall accumulated data. The phase accumulator 42 generates a timing pulse PA based on the coarse timing of the overall accumulated data while outputs timing data DA indicating a fine timing of the timing pulse PA. The timing data DA is a remainder of integer multiple of the reference clock period in the overall accumulated data.

The timing pulse PA is generated by counting the reference clock pulse for the period defined as the coarse timing. The timing pulse PA is also used as a timing reference for other three timing pulses corresponding to the rate data TA, TB and TC. Further, the phase accumulator 42 outputs a system clock and a read clock in synchronism with the timing pulse PA.

The counter 43 outputs a timing pulse PB which is delayed, from the timing pulse PA, by the period of the coarse timing indicted in the rate data TA from the register 51 of the temporary storage 38. The counter 43 is provided with the reference clock and counts the number of the reference clock for the period defined by the coarse timing of the rate data TA. Thus, by counting the appropriate number of the reference clock, the timing pulse PB is generated which is provided to the waveform generator 33.

The counter 44 outputs a timing pulse PC which is delayed, from the timing pulse PB, by the period of the coarse timing indicted in the rate data TB from the register 52 of the temporary storage 38. The counter 44 is provided with the reference clock and counts the number of the reference clock for the period defined by the coarse timing of the rate data TB. Thus, by counting the appropriate number of the reference clock, the timing pulse PC is generated which is provided to the waveform generator 33.

The counter 45 outputs a timing pulse PD which is delayed, from the timing pulse PC, by the period of the coarse timing indicted in the rate data TC from the register 53 of the temporary storage 38. The counter 45 is provided with the reference clock and counts the number of the reference clock for the period defined by the coarse timing of the rate data TC. Thus, by counting the appropriate number of the reference clock, the timing pulse PD is generated which is provided to the waveform generator 33.

The accumulator 46 adds the timing data PDA showing the fine timing of the previous test cycle from the phase accumulator 42 to the fine timing data in the rate data TA from the register 51. Based on this addition, the accumulator 46 generates timing data DB indicating a fine timing for the timing pulse PB.

The accumulator 47 adds the timing data DB produced by the accumulator 46 showing the fine timing for the timing pulse PB to the fine timing data in the rate data TB from the register 52. Based on this addition, the accumulator 47 generates timing data DC indicating a fine timing for the timing pulse PC.

The accumulator 48 adds the timing data DC produced by the accumulator 47 showing the fine timing for the timing pulse PC to the fine timing data in the rate data TB from the register 53. Based on this addition, the accumulator 48 generates timing data DD indicating a fine timing for the timing pulse PD.

The waveform generator 33 receives four sets of the timing pulse and the timing data in parallel from the timing generator 31. The waveform generator has four delay circuits 61–64 in parallel each of which receives a corresponding set of the timing pulse and the timing data. In each of the delay circuits, a set of delay elements is provided whereby the delay data is converted to a corresponding delay time. Each of the timing pulses passes through the corresponding delay element while receiving the delay time produced based on fine timing expressed in the delay data.

Therefore, the timing pulse PA is delayed by the delay time defined by the timing data DA in the delay circuit 61 and the timing pulse PB is delayed by the delay time defined by the timing data DB in the delay circuit 62. Similarly, the timing pulse PC is delayed by the delay time defined by the timing data DC in the delay circuit 63 and the timing pulse PD is delayed by the delay time defined by the timing data DC in the delay circuit 64.

The waveform generator 33 further includes an OR circuit 68 to combine all the timing pulses which have been provided with delay times in the delay elements. As a consequence, the parallel timing pulses are converted to a series timing signal each timing of the pulse is defined with reference to the previous pulse. Therefore, timing signals (test signals) having four times higher repetition rate will be generated by the rate generator circuit of the present invention.

FIG. 3 is a timing chart showing an operation of the embodiment of the present invention shown in FIG. 2. In the example of FIG. 3, the rate data AA is 2.2 ns, BB is 2.8 ns, CC is 3.0 ns and DD is 2.6 ns, respectively, and this data setting continues for two cycles of test signal generation. A fine timing in a previous cycle is assumed to be zero. It is also assumed that the reference clock rate is 1 ns and thus a coarse timing in this example is an integer multiple of 1 ns clock period. Thus, a fine timing in this case is smaller than 1 ns having a 0.1 ns resolution.

Figures 3A, 3B:
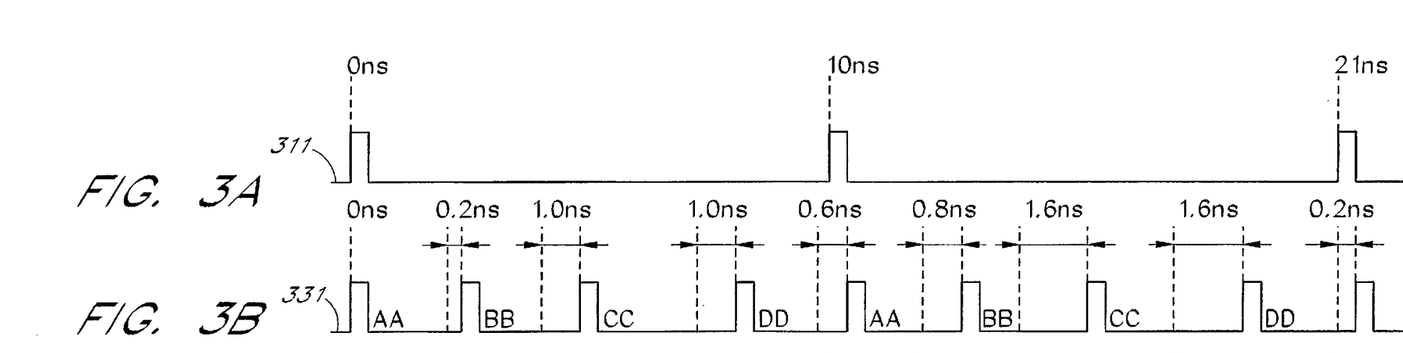
FIG. 3 is a timing chart showing an operation of the embodiment of the present invention of FIG. 2.
Figure 3C:
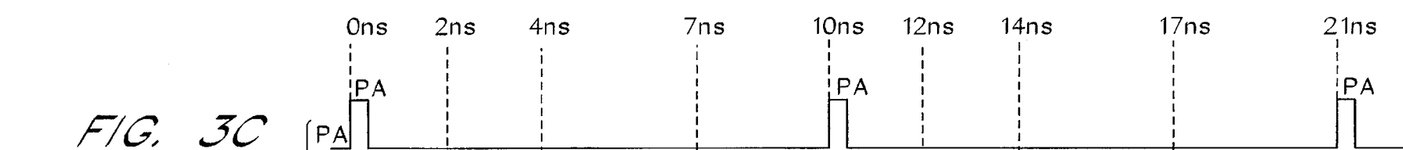
Figures 3D, 3E, 3F:
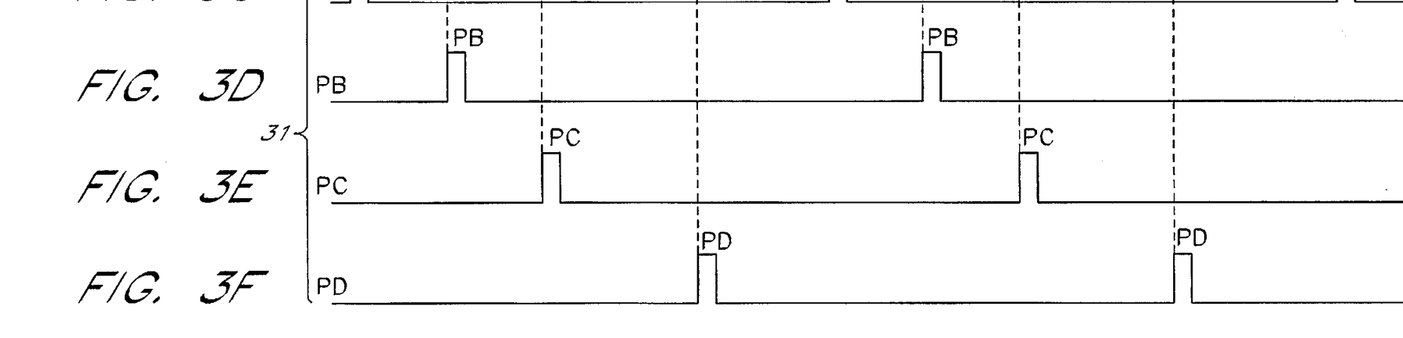
Figure 3G:
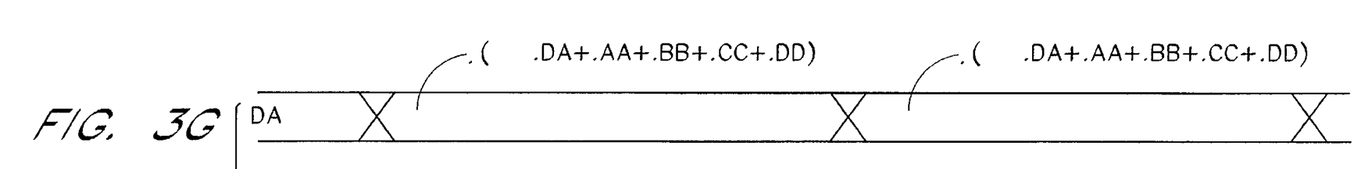
Figure 3H:
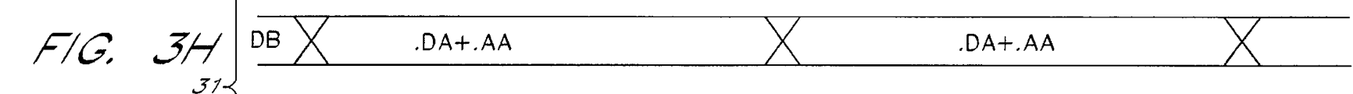
Figure 3I:
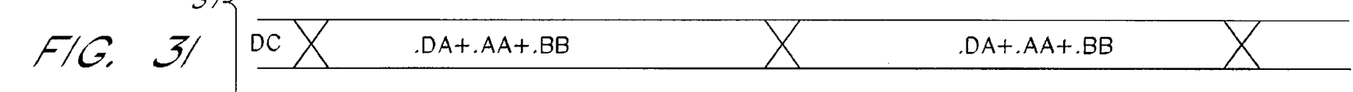
Figure 3J:
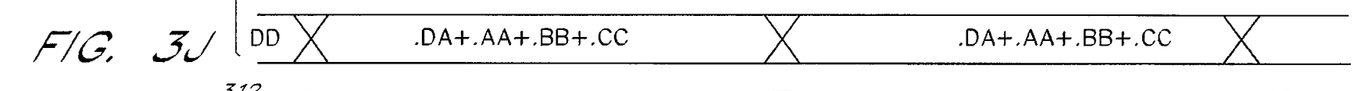
Figure 3K:
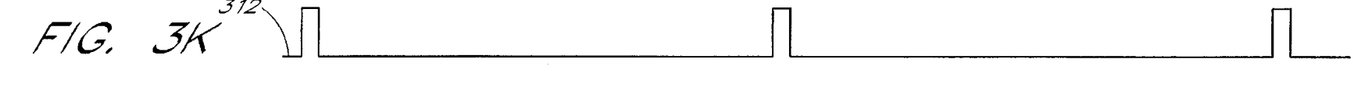
Figure 3L:
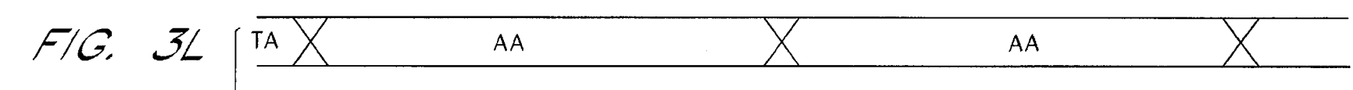
Figure 3M:
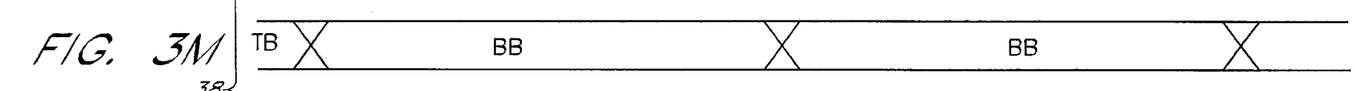
Figure 3N:
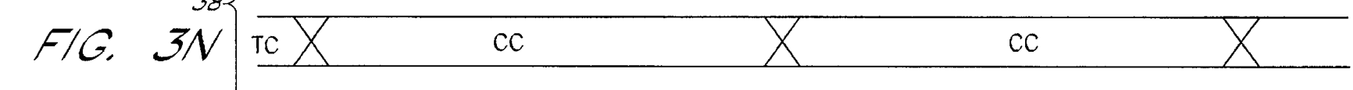
Figure 3O:
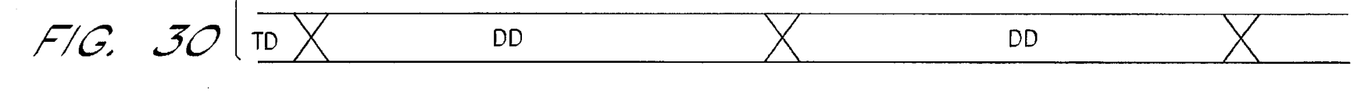

At a time 0 ns, the system clock 311 and the read clock 312 are generated in synchronism with a timing pulse PA as in FIGS. 3A, 3C and 3K. Receiving the read clock 312 by the temporary storage 38, the four rate data AA, BB, CC, and DD are transferred in parallel to the timing generator 31 as shown in FIGS. 3l–3O. As in FIG. 2, the four rate data are accumulated by the data accumulator 41 and the result of the accumulation is received by the phase accumulator 42. In the phase accumulator 42, the result received from the data accumulator 41 is added to the timing data remained from the previous cycle to obtain an overall accumulated data.

In the example of FIG. 3, since the sum of the four rate data is 10.6 ns and the fine timing remained from the previous cycle is 0 ns, the total of 10.6 ns (overall accumulated data) is obtained in the phase accumulator 42. Thus, in the next cycle, the second timing pulse PA is generated, as shown in FIG. 3C, at 10 ns after the first timing pulse PA since the coarse timing is 10 ns and the fine timing, i.e. the timing data DA of FIG. 3G is 0.6 ns. The second timing pulse PA is generated, for example, by counting the number of reference clock. The timing pulse PA and the timing data DA are provided to the waveform generator 33.

In the further next cycle, since the rate data AA, BB, CC and DD are the same as the previous cycle in this example, the sum of the four rate data is 10.6 ns. The fine timing in the precious cycle is 0.6 ns as noted above, the overall accumulated data of the timings in the phase accumulator 42 is 11.2 ns. Thus, the third timing pulse PA is generated 11 ns after the second timing pulse PA, i.e., 21 ns after the first timing pulse PA as shown in FIG. 3C.

The timing pulse PB of FIG. 3D is determined by the coarse timing in the rate data TA with reference to the timing pulse PA. In the example of FIG. 3, since the rate data TA is AA=2.2 ns, the coarse timing of 2 ns determines the timing of the timing pulse PB. Thus, the first timing pulse PB is generated 2 ns after the first timing pulse PA.

The timing pulse PC of FIG. 3E is determined by the coarse timing in the rate data TB with reference to the timing pulse PB. In the example of FIG. 3, since the rate data TB is BB=2.8 ns, the coarse timing of 2 ns determines the timing of the timing pulse PC. Thus, the first timing pulse PC is generated 2 ns after the first timing pulse PB. Similarly, the timing pulse PD of FIG. 3F is determined by the coarse timing in the rate data TC with reference to the timing pulse PC. Since the rate data TC is CC=3.0 ns, the first timing pulse PD is generated 3 ns after the first timing pulse PC.

As noted above, the timing pulses PB, PC and PD are generated based only on the coarse timing of the rate data. Since the rate data for the next cycle is the same as the present cycle, the timing pulses PB, PC and PD in the next cycle are generated in the same way as in the foregoing with reference to the second timing pulse PA which is 10 ns delayed from the first timing pulse PA.

The timing data DA of FIG. 3G for the timing pulse PA is calculated by adding the four rate data by the data accumulator 41 and further adding the fine timing remained from the previous cycle by the phase accumulator 42, i.e., the overall accumulated data. In the example of FIG. 3, since the sum of the four rate data is 10.6 ns and the fine timing from the pervious cycle is assumed 0 ns, the total amount (overall accumulated data) is also 10.6 ns. Thus, the timing data DA showing the fine timing of 0.6 ns is generated by the phase accumulator 42 by taking only the data smaller than 1 ns.

The timing data DA is generated along with the second timing pulse PA by the phase accumulator 42. The second timing pulse PA of FIG. 3C which is 10 ns delayed from the first timing pulse PA is further provided with the small delay time of 0.6 ns as shown in FIG. 3B by the delay circuit 61 of FIG. 2.

In the next cycle of the timing pulse PA, the sum of the four rate data is again 10.6 ns and the fine timing in the previous cycle is 0.6 ns. The overall accumulated data by the phase accumulator is 11.2 ns. Thus, the timing data DA showing the fine timing of 0.2 ns is generated by the phase accumulator 42 along with the third timing pulse PA. The third timing pulse PA of FIG. 3C which is 11 ns delayed from the second timing pulse PA is further provided with the small delay time of 0.2 ns as shown in FIG. 3B by the delay circuit 61 of FIG. 2.

The timing data DB of FIG. 3H is formed by the sum of the fine timing PDA of the previous cycle from the phase accumulator 42 and the fine timing of the rate data TA of the present cycle. The accumulator 46 performs the calculation and outputs the timing data DB showing the accumulated value. In the example of FIG. 3, for the first timing pulse PB, since the fine timing of the previous cycle is 0 ns and the rate data TA shows AA=2.2 ns, the fine timing is 0.2 ns in this case, and thus the sum of which is also 0.2 ns. Thus, the accumulator 46 generates the timing data DB showing delay time of 0.2 ns. This small delay time is added to the timing pulse PB from the counter 43 as shown in FIG. 3B by the delay circuit 62 of FIG. 2.

In the next cycle of the timing pulse PB which is delayed 2 ns from the second timing pulse PA, the fine timing of the previous cycle is 0.6 ns and the rate data TA shows AA=2.2 ns, i.e., the fine timing of 0.2 ns. Thus, the sum of the fine timings is 0.8 ns which is obtained by the accumulator 46. Thus, the timing data DB showing the fine timing of 0.8 ns is generated by the accumulator 46. As a result, the second timing pulse PB of FIG. 3D is provided with the small delay time of 0.8 ns as shown in FIG. 3B by the delay circuit 62 of FIG. 2.

The timing data DC of FIG. 3I is formed by the sum of the timing data DB from the accumulator 46 and the fine timing of the rate data TB of the present cycle. The accumulator 47 performs the calculation and outputs the timing data DC showing the accumulated value. In the example of FIG. 3, for the first timing pulse PC which is delayed by 2 ns from the first timing pulse PB, since the timing data DB is 0.2 ns and the rate data TB shows BB=2.8 ns, i.e., the fine timing of 0.8 ns, the sum of which is 1.0 ns. Thus, the accumulator 47 generates the timing data DC showing delay time of 1.0 ns. As shown in FIG. 3B, this delay time of 1.0 ns is added to the timing pulse PC of FIG. 3E from the counter 44 by the delay circuit 63 of FIG. 2.

In the next cycle of the timing pulse PC which is delayed 2 ns from the second timing pulse PB, the timing data DB from the accumulator 46 is 0.8 ns (0.6 ns plus 0.2 ns), and the rate data TB shows BB=2.8 ns, i.e., the fine timing of 0.8 ns. Thus, the sum of the fine timings is 1.6 ns is obtained by the accumulator 47. Thus, the timing data DC showing the timing of 1.6 ns is generated by the accumulator 47. As a result, the second timing pulse PC of FIG. 3E is provided with the delay time of 1.6 ns as shown in FIG. 3B by the delay circuit 63 of FIG. 2.

The timing data DD of FIG. 3J is formed by the sum of the timing data DC from the accumulator 47 and the fine timing of the rate data TC of the present cycle. The accumulator 48 performs the calculation and outputs the timing data DD showing the accumulated value. In the example of FIG. 3, for the first timing pulse PD which is delayed by 3 ns from the first timing pulse PC, since the timing data DC is 1.0 ns and the rate data TC shows CC=3.0 ns, i.e., the fine timing of 0 ns, the sum of which is also 1.0 ns. Thus, the accumulator 48 generates the timing data DD showing delay time of 1.0 ns. As shown in FIG. 3B, this delay time of 1.0 ns is added to the timing pulse PD of FIG. 3F from the counter 45 by the delay circuit 64 of FIG. 2.

In the next cycle of the timing pulse PD which is delayed 3 ns from the second timing pulse PC, the timing data DC from the accumulator 47 is 1.6 ns, and the rate data TC shows CC=3.0 ns, i.e., the fine timing of 0 ns. Thus, the sum of the fine timings is 1.6 ns which is obtained by the accumulator 48. Thus, the timing data DD showing the timing of 1.6 ns is generated by the accumulator 48. As a result, the second timing pulse PD of FIG. 3F is provided with the delay time of 1.6 ns as shown in FIG. 3B by the delay circuit 64 of FIG. 2.

As in the foregoing, the waveform generator 33 receives the four sets of the timing pulse and the timing data in parallel from the timing generator 31. The delay circuits 61–64 provide the delay time indicated by the timing data DA-DD to the corresponding timing pulses PA-PD. The timing pulses from the delay circuits 61–64 are combined by the OR circuit whereby converted to a series pulse signal as shown in FIG. 3B. Therefore, the timing signals (test signals) having four times higher frequency than each of the parallel timing pulses is generated by the rate generator circuit of the present invention.

FIG. 6 shows an example of a phase accumulator to be used in the embodiments of FIGS. 1 and 2. The phase accumulator of FIG. 6 includes a counter 73, an adder 74, a delay circuit 81 and a delay flip-flop 82. Each component of the phase accumulator is provided with a reference clock CL. The phase accumulator receives the data from the data accumulator 41 of FIG. 2. The coarse timing of the data is applied to the counter 73 while the fine timing of the data is applied to the adder 74. The phase accumulator outputs a timing pulse PA and timing data DA as discussed with reference to FIGS. 1–3.

Based on the coarse timing in the data received from the data accumulator 41, the counter 73 down counts the number of the reference clock. Thus, in case where the coarse timing shows 3 ns, and the reference clock period is 1 ns, by counting three pulses of the reference clock, the counter 73 produces a timing pulse PA which is output to the waveform generator of FIGS. 1 and 2 through the delay circuit 81. The timing pulse PA is also used as the system clock and the write and read clock of FIGS. 1–3.

Based on the fine timing in the data received from the data accumulator 41, the adder 74 adds the fine timing in the data to the data returned from the delay flip-flip 82. The data from the flip-flop 82 indicates the fine timing of the previous cycle of the system clock. The added result is output as the timing data DA and supplied to the waveform generator through the delay flip-flop 82.

In case where the adder 74 produces a carry because the added result is greater than 1 ns, the carry signal is provided to the delay circuit 81 and only a fine timing smaller than 1 ns is output as the timing data DA. By receiving the carry signal from the adder 74, the delay circuit provides an additional one cycle of the reference clock to the timing pulse from the counter 73. Thus, in such a case, the timing pulse PA whose timing is 1 ns longer than the output of the counter 73 is provided at the output of the phase accumulator of FIG. 6.

As has been foregoing, according to the present invention, the rate generator circuit for a semiconductor test system can generate a high repetition rate of test pattern signals without using a high speed circuit components. Thus, it is possible to generate high frequency test pattern signals with low cost. As a result, in the example of processing four rate data in parallel and a frequency of the each rate data is 125 MHz (8 ns period) as in the conventional technology, the rate generator circuit of the present invention can generate four times higher frequency timing pulses, i.e., 500 MHz (2 ns period) without using any higher speed circuit components.

What is claimed is:

1. A rate generator circuit to be used in a semiconductor test system for generating test signals whose timings vary in a pulse by pulse basis for testing semiconductor devices, comprising:

a reference clock to determine a basic operational timing of said semiconductor test system;

a pattern generator which stores rate data indicating timings of each pulse for said test signals for reading out a plurality of said rate data in parallel at the same time in synchronism with a system clock, each of said rate data from said temporary storage being a combination of a coarse timing of said pulse which is an integer multiple of a period of said reference clock and a fine timing of said pulse which is a time length shorter than said period of said reference clock;

a temporary storage for receiving said plurality of said rate data in parallel from said pattern generator and transferring said plurality of rate data in synchronism with said system clock;

a timing generator for receiving said plurality of said rate data in parallel from said temporary storage and generating a plurality of sets of a timing pulse and timing data, at least one set of said timing pulse and said timing data is produced based on a sum of all of said plurality of said rate data and a fine timing of a previous cycle of said system clock, and each of the other sets of said timing pulse and said timing data is produced based on corresponding one of said plurality of said rate data and said fine timing of said previous cycle; and a waveform generator for receiving said plurality of sets of said timing pulse and said timing data in parallel for adding a delay time indicated by said timing data which is smaller than said period of said reference clock to corresponding one of said timing pulse, said waveform generator converting said plurality of said timing pulses provided with said delay times into a series signal.

2. A rate generator circuit as defined in claim 1, wherein said system clock is in synchronism with said timing pulse produced by said coarse timing in the sum of all of said plurality of said rate data received by said timing generator in parallel at the same time and said fining timing of said previous cycle of said system clock.

3. A rate generator circuit as defined in claim 1, wherein said temporary storage is formed of a plurality of storage circuit arranged in parallel to transfer said plurality of said rate data, each of said storage circuit being formed of two or more stages of series connected storage elements wherein said rate data shifting to the next stage of said storage element when receiving a read clock which is synchronized with said system clock.

4. A rate generator circuit as defined in claim 1, wherein said timing generator comprising:

means for accumulating all of said rate data received in parallel in the present cycle of said system clock and said fine timing of said previous cycle of said system clock to obtain an overall accumulated timing and generating one of said timing pulses based on said coarse timing in said accumulated timing;

means for holding said fine timing of said overall accumulated timing for the next cycle of said system clock;

at least one set of an accumulator and a counter, said counter forming another timing pulse based on the coarse timing in one of said rate data, and forming timing data for said another timing pulse by adding the fine timing of said previous cycle and the fine timing of said one of said rate data.

5. A rate generator circuit as defined in claim 1, wherein said timing generator includes a plurality of sets of a counter and an accumulator which generates said plurality of sets of said timing pulse and said timing data, and a phase accumulator for accumulating said fine timing of said previous cycle with said sum of all of said plurality of said rate data for forming an overall accumulated timing.

6. A rate generator circuit as defined in claim 5, wherein said phase accumulator includes an adder for adding said fine timing of said previous cycle to said sum of all of said plurality of said rate data for forming an overall accumulated timing, and a cycle delay circuit for delaying a timing pulse corresponding to said coarse timing of said overall accumulated timing by one cycle of said reference clock when a carry is generated by said adder.

7. A rate generator circuit as defined in claim 1, wherein said waveform generator includes a plurality of delay circuits each of which receiving a corresponding set of said timing pulse and said timing data from said timing generator, and an OR circuit to combine said timing pulses from said delay circuits to form said series signal.

8. A rate generator circuit to be used in a semiconductor test system for generating test signals whose timings vary in a pulse by pulse basis for testing semiconductor devices, comprising:

a reference clock to determine a basic operational timing of said semiconductor test system;

a pattern generator which stores rate data indicating timings of each pulse for said test signals for reading out four rate data in parallel at the same time in synchronism with a system clock;

a temporary storage for receiving said four rate data in parallel from said pattern generator and transferring said four rate data in synchronism with said system clock;

a timing generator for receiving said four rate data in parallel from said temporary storage and generating four sets of a timing pulse and timing data, each of said rate data from said temporary storage being a combination of a coarse timing of said pulse which is an integer multiple of a period of said reference clock and a fine timing of said pulse which is a time length shorter than said period of said reference clock, at least one set of said timing pulse and said timing data is produced based on a sum of said four rate data and a fine timing of a previous cycle of said system clock, and each of the other three sets of said timing pulse and said timing data is produced based on corresponding one of said four rate data and said fine timing of said previous cycle; and a waveform generator for receiving said four sets of said timing pulse and said timing data in parallel for adding a delay time indicated by said timing data which is smaller than said period of said reference clock to corresponding one of said timing pulse, said waveform generator converting said four timing pulses provided with said delay times into a series signal.

* * * * *